(12) United States Patent
Gu et al.

(10) Patent No.: US 10,984,879 B2
(45) Date of Patent: Apr. 20, 2021

(54) SHIFT REGISTER UNIT AND METHOD FOR DRIVING THE SAME, GATE DRIVING CIRCUIT AND DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Xiaofang Gu, Beijing (CN); Xiaoye Ma, Beijing (CN); Ruifang Du, Beijing (CN); Donghui Zhang, Beijing (CN); Guodong Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/392,466

(22) Filed: Apr. 23, 2019

(65) Prior Publication Data
US 2020/0027515 A1  Jan. 23, 2020

(30) Foreign Application Priority Data
Jul. 20, 2018 (CN) .......................... 201810809251.2

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS

| 8,633,888 B2 * | 1/2014 | Kim ....................... G11C 19/28 345/100 |
| 10,043,477 B2 | 8/2018 | Li |

(Continued)

FOREIGN PATENT DOCUMENTS

| CN | 102800289 A | 11/2012 |
| CN | 106098003 A | 11/2016 |

(Continued)

OTHER PUBLICATIONS

First Chinese Office Action dated Jun. 3, 2020, for corresponding Chinese Application No. 201810809251.2.

*Primary Examiner* — Tuan T Lam
(74) *Attorney, Agent, or Firm* — Kinney & Lange, P.A.

(57) ABSTRACT

A shift register unit and a method for driving the same, a gate driving circuit, and a display apparatus are disclosed. The shift register unit includes: an input circuit configured to transmit an input signal to a pull-up node; an output circuit configured to transmit a clock signal to an output signal terminal under control of a voltage at the pull-up node; a first reset circuit configured to reset the pull-up node to a first level under control of a first reset signal; a first pull-down control circuit configured to control levels at the pull-up node and the output signal terminal under control of a first control signal; and a first voltage control circuit electrically connected to a second control signal terminal, and configured to control a voltage signal waveform at the first pull-down node under control of a second control signal.

16 Claims, 15 Drawing Sheets

(51) Int. Cl.
  *G09G 3/20* (2006.01)
  *G09G 3/36* (2006.01)
(52) U.S. Cl.
  CPC .............. *G09G 2300/0426* (2013.01); *G09G 2310/0286* (2013.01); *G09G 2310/08* (2013.01)

(56) References Cited

U.S. PATENT DOCUMENTS

| | | | | |
|---|---|---|---|---|
| 2006/0290390 A1* | 12/2006 | Jang | ........................ | G11C 19/28 327/112 |
| 2010/0156858 A1* | 6/2010 | Moon | ................... | G09G 3/3674 345/204 |
| 2014/0091997 A1* | 4/2014 | Han | ..................... | G09G 3/3611 345/92 |
| 2015/0002504 A1* | 1/2015 | Jo | ........................ | G09G 3/3677 345/213 |
| 2016/0093264 A1 | 3/2016 | Gu et al. | | |
| 2016/0125954 A1* | 5/2016 | Gu | ....................... | G09G 3/3688 377/64 |
| 2017/0261828 A1* | 9/2017 | Noma | ................... | G09G 3/3648 |
| 2017/0270851 A1* | 9/2017 | Shang | ................... | G09G 3/2092 |
| 2017/0278473 A1* | 9/2017 | Shang | .................... | G11C 19/28 |
| 2018/0174545 A1 | 6/2018 | Li | | |
| 2019/0318796 A1 | 10/2019 | Xiong et al. | | |
| 2019/0325836 A1* | 10/2019 | Qian | ........................ | G11C 7/02 |
| 2020/0013361 A1* | 1/2020 | Lv | .......................... | G11C 19/28 |
| 2020/0211669 A1* | 7/2020 | Li | .............................. | G09G 3/20 |
| 2020/0273503 A1 | 8/2020 | Wang | | |

FOREIGN PATENT DOCUMENTS

| | | |
|---|---|---|
| CN | 106935206 A | 7/2017 |
| CN | 107146570 A | 9/2017 |
| CN | 107833552 A | 3/2018 |
| CN | 107909960 A | 4/2018 |
| CN | 107978294 A | 5/2018 |
| CN | 108257578 A | 7/2018 |
| CN | 108281123 A | 7/2018 |

* cited by examiner

SHIFT REGISTER UNIT AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201810809251.2, filed on Jul. 20, 2018, which is incorporated herein by reference in its entirety.

TECHNICAL FIELD

The present disclosure relates to the field of display, and more particularly, to a shift register unit and a method for driving the same, a gate driving circuit, and a display apparatus.

BACKGROUND

In a Thin Film Transistor (TFT)-based Liquid Crystal Device (LCD), a gate driving circuit for driving a gate may be formed on a display panel to form a Gate drive On Array (GOA) panel. The gate driving circuit comprises a plurality of cascaded shift register units. In a conventional gate driving circuit, an output signal of a next stage of shift register unit is usually used as a reset signal of a current stage of shift register unit, and an output signal of a previous stage of shift register unit is usually used as an input signal of the current stage of shift register unit.

However, in a case that there is extremely low or extremely high external temperature, an output signal of the shift register unit may have a deformed waveform.

SUMMARY

Embodiments of the present disclosure provide a shift register unit and a method for driving the same, a gate driving circuit, and a display apparatus.

According to an aspect of the embodiments of the present disclosure, there is provided a shift register unit, comprising:

an input circuit electrically connected to an input signal terminal and a pull-up node of the shift register unit, and configured to transmit an input signal from the input signal terminal to the pull-up node;

an output circuit electrically connected to an output signal terminal, a clock signal terminal and the pull-up node, and configured to transmit a clock signal from the clock signal terminal to the output signal terminal under control of a voltage at the pull-up node;

a first reset circuit electrically connected to a first reset signal terminal, the pull-up node and a first level terminal, and configured to reset the pull-up node to a first level at the first level terminal under control of a first reset signal from the first reset signal terminal;

a first pull-down control circuit electrically connected to a first control signal terminal, the pull-up node, a first pull-down node of the shift register unit, the first level terminal, and the output signal terminal, and configured to control levels at the pull-up node and the output signal terminal using the first level at the first level terminal under control of a first control signal from the first control signal terminal; and a first voltage control circuit electrically connected to a second control signal terminal, the first pull-down node and the first level terminal, and configured to control a voltage signal waveform at the first pull-down node using the first level at the first level terminal under control of a second control signal from the second control signal terminal.

In an example, the shift register unit according to the embodiments of the present disclosure further comprises:

a second voltage control circuit electrically connected to the input signal terminal, the first pull-down node, and the first level terminal, and configured to control the voltage signal waveform at the first pull-down node using the first level at the first level terminal under control of the input signal.

In an example, the first voltage control circuit comprises a first transistor, wherein a control electrode of the first transistor is electrically connected to the second control signal terminal, a first electrode of the first transistor is electrically connected to the first level terminal, and a second electrode of the first transistor is electrically connected to the first pull-down node.

In an example, the second voltage control circuit comprises a second transistor, wherein a control electrode of the second transistor is electrically connected to the input signal terminal, a first electrode of the second transistor is electrically connected to the first level terminal, and a second electrode of the second transistor is electrically connected to the first pull-down node.

In an example, the shift register unit the embodiments of the present disclosure further comprises:

a second pull-down control circuit electrically connected to a third control signal terminal, the pull-up node, a second pull-down node of the shift register unit, the first level terminal and the output signal terminal, and configured to control the levels at the pull-up node and the output signal terminal using the first level at the first level terminal under control of a third control signal from the third control signal terminal.

In an example, the first voltage control circuit is further electrically connected to the second pull-down node, and is further configured to control a voltage signal waveform at the second pull-down node using the first level at the first level terminal under control of the second control signal.

In an example, the first voltage control circuit further comprises a third transistor, wherein a control electrode of the third transistor is electrically connected to the second control signal terminal, a first electrode of the third transistor is electrically connected to the first level terminal, and a second electrode of the third transistor is electrically connected to the second pull-down node.

In an example, the second voltage control circuit is further electrically connected to the second pull-down node, and is further configured to control a voltage signal waveform at the second pull-down node using the first level at the first level terminal under control of the input signal.

In an example, the second voltage control circuit further comprises a fourth transistor, wherein a control electrode of the fourth transistor is electrically connected to the input signal terminal, a first electrode of the fourth transistor is electrically connected to the first level terminal, and a second electrode of the fourth transistor is electrically connected to the second pull-down node.

In an example, the output circuit comprises a fifth transistor and a first capacitor, wherein a control electrode of the fifth transistor is electrically connected to the pull-up node, a first electrode of the fifth transistor is electrically connected to the clock signal terminal, and a second electrode of the fifth transistor is electrically connected to the output signal terminal; and a first terminal of the first capacitor is electrically connected to the control electrode of the fifth transistor, and a second terminal of the first capacitor is electrically connected to the output signal terminal.

In an example, the output circuit further comprises a sixth transistor, wherein a control electrode of the sixth transistor is electrically connected to the pull-up node, a first electrode of the sixth transistor is electrically connected to the clock signal terminal, and a second electrode of the sixth transistor is electrically connected to the second output signal terminal.

In an example, the shift register unit the embodiments of the present disclosure further comprises:

a second reset circuit electrically connected to a second reset signal terminal, the first level terminal, the pull-up node and the output signal terminal, and configured to reset the pull-up node and the output signal terminal to the first level at the first level terminal under control of a second reset signal from the second reset signal terminal.

According to another aspect of the embodiments of the present disclosure, there is provided a gate driving circuit, comprising N stages of cascaded shift register units according to any of the embodiments described above. A clock signal terminal of an $n^{th}$ stage of shift register unit receives one of a first clock signal to an $I^{th}$ clock signal, an output signal terminal or a second output signal terminal of the $n^{th}$ stage of shift register unit is electrically connected to an input signal terminal of an $(n+I/2)^{th}$ stage of shift register unit, and a first reset signal terminal of the $n^{th}$ stage of shift register unit is electrically connected to an output signal terminal or a second output signal terminal of an $(n+1+I/2)^{th}$ stage of shift register unit, wherein N is an integer greater than or equal to 4, n is an integer greater than or equal to 1 and less than (N−I/2), and I is an even number.

In an example, a second control signal terminal of the $n^{th}$ stage of shift register unit is electrically connected to an output signal terminal or a second output signal terminal of an $(n+K)^{th}$ stage of shift register unit, wherein K is an integer greater than or equal to 1 and less than or equal to I/2.

According to yet another aspect of the embodiments of the present disclosure, there is provided a display apparatus, comprising the gate driving circuit according to any of the embodiments described above.

According to a further aspect of the embodiments of the present disclosure, there is provided a method for driving the shift register unit according to any of the embodiments described above, comprising:

providing, in a first period, an input signal having a second level, so that a potential at the pull-up node is raised up;

providing, in a second period, a clock signal having the second level, so that the potential at the pull-up node is further raised up, and the output signal terminal and the second output signal terminal output a gate driving signal having the second level;

providing, in a third period, a second control signal having the second level, so that the first pull-down node is maintained at the first level; and providing, in a fourth period, a reset signal having the second level, so that the pull-up node and the output signal terminal are reset to the first level.

In an example, the third period comprises a first sub-period and a second sub-period, the method further comprising:

providing, in the first sub-period, a clock signal having the second level, so that the output signal terminal and the second output signal terminal continue to output the gate driving signal having the second level, and the potential at the pull-up node is maintained at the level at the pull-up node in the second period; and providing, in the second sub-period, a clock signal having the first level, so that the output signal terminal and the second output signal terminal output the first level, and the potential at the pull-up node falls to the level at the pull-up node in the first period.

DETAILED DESCRIPTION

Figure 1:
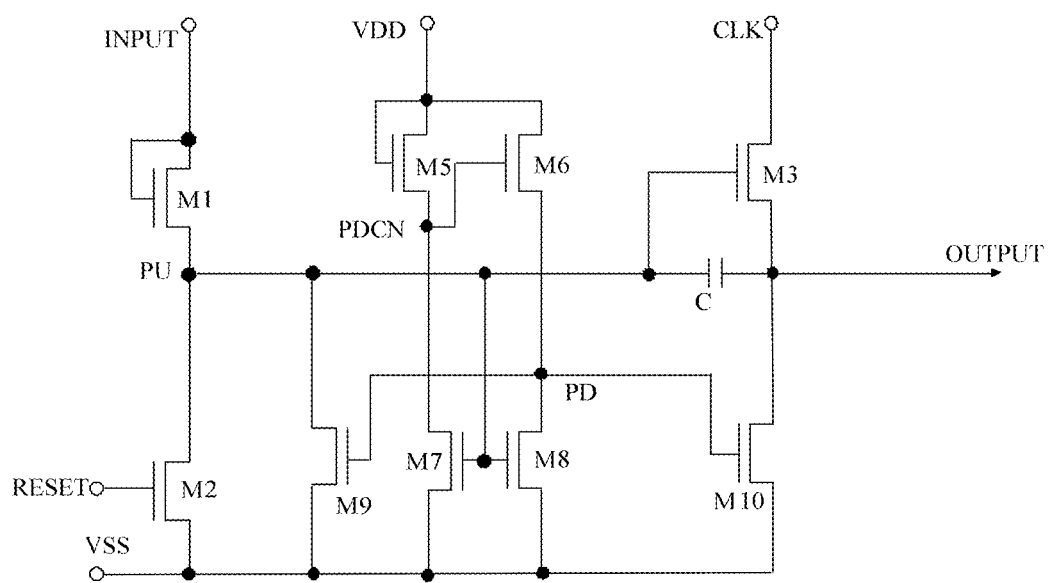
FIG. 1 illustrates an exemplary circuit diagram of a shift register unit.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or configuration will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "electrically connected" may mean that two components are directly electrically connected, or that two components are electrically connected via one or more other components. In addition, the two components may be electrically connected by wire or wirelessly.

In addition, in the description of the embodiments of the present disclosure, the terms "first level" and "second level" are only used to distinguish magnitudes of the two levels from each other. For example, the following description is made by taking the "first level" being a low level and the "second level" being a high level as an example. It may be understood by those skilled in the art that the present disclosure is not limited thereto.

The transistors used in the embodiments of the present disclosure may each be a thin film transistor or a field effect transistor or other devices having the same characteristics. In some embodiments, the thin film transistor used in the embodiments of the present disclosure may be an oxide semiconductor transistor. Since a source and a drain of the thin film transistor used herein are symmetrical, the source and the drain thereof may be interchanged. In the embodiments of the present disclosure, a gate is referred to as a control electrode, one of the source and the drain is referred to as a first electrode, and the other of the source and the drain is referred to as a second electrode. In the following examples, the description is made by taking an N-type thin film transistor as an example. It may be understood by those skilled in the art that the embodiments of the present disclosure may obviously applied to a case of a P-type thin film transistor.

Figure 2A:
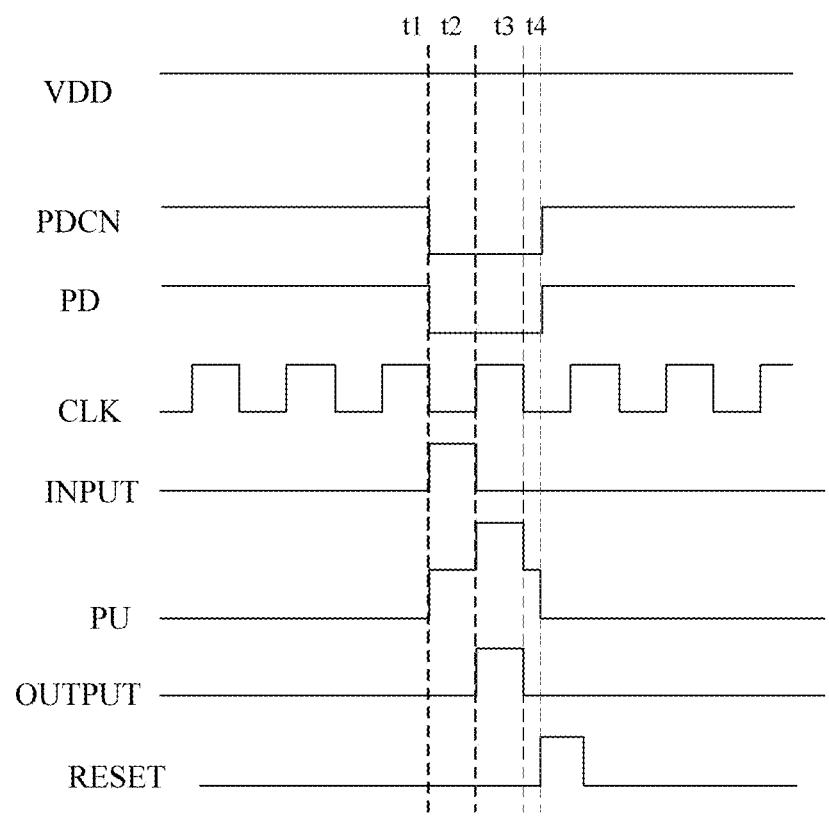
FIG. 2A illustrates an operational timing diagram of the shift register unit of FIG. 1.

FIG. 1 illustrates an exemplary circuit diagram of an exemplary shift register unit, and FIG. 2A illustrates an operational timing diagram of the shift register unit of FIG. 1. Next, an operation of the shift register unit of FIG. 1 will be described with reference to FIGS. 1 and 2A.

As shown in FIG. 1, description is made by taking an example in which all switching transistors are NMOS transistors. In the circuit structure shown in FIG. 1, description is made by taking a power supply signal terminal VDD being at a high level and a reference signal at a reference signal terminal VSS being a low level signal as an example.

As shown in FIG. 2A, in a period t1, a reset signal at a reset signal terminal RESET and an input signal at an input signal terminal INPUT are both at a low level, and a power supply signal at the power supply signal terminal VDD is at a high level. At this time, a transistor M5 is turned on, and the power supply signal VDD is transmitted to a node PDCN, so that a transistor M6 is turned on. The transistor M6 is turned on, so that a pull-down node PD is at a high level, so that a transistor M9 and a transistor M10 are turned on. Thereby, the reference voltage signal VSS at a low level is transmitted to a pull-up node PU and an output signal terminal OUTPUT through the transistor M9 and the transistor M10, respectively, to continuously de-noise the pull-up node PU and the output signal terminal OUTPUT, that is, a signal at the pull-up node PU and an output signal at the output signal terminal OUTPUT are both at a low level.

In a period t2, the input signal at the input signal terminal INPUT is at a high level, a transistor M1 is turned on, and a voltage at the pull-up node PU starts to rise to charge a capacitor C. Since the pull-up node PU is at a high level, a transistor M7 and a transistor M8 are turned on, and the reference voltage signal VSS is transmitted to the node PDCN and the pull-down node PD through the transistor M7 and the transistor M8, respectively. At the same time, since the pull-up node PU is at a high level, a transistor M3 is turned on, to transmit a clock signal at a clock signal terminal CLK to the output signal terminal OUTPUT. Since the clock signal is at a low level at this time, the output signal at the output signal terminal OUTPUT is also at a low level.

In a period t3, the clock signal at the clock signal terminal CLK is at a high level, the transistor M3 is continuously turned on under action of the pull-up node PU to transmit the clock signal to the output signal terminal OUTPUT, and at this time, the output signal at the output signal terminal OUTPUT is at a high level. A potential at the pull-up node PU is bootstrapped to a higher potential under the bootstrap action of the storage capacitor C.

In a period t4, the clock signal at the clock signal terminal CLK is at a low level, and at this time, the output signal at the output signal terminal OUTPUT is a low level signal. The level at the pull-up node PU starts to fall, but since the clock signal is at a low level, the potential at the pull-up node PU is still at a relatively high level, at which the transistors may be turned on, under the bootstrap action of the storage capacitor C.

It may be seen from the above description that, in the period t1, the power supply signal VDD continuously de-noises the pull-up node PU and the output signal terminal OUTPUT. In the periods t2, t3 and t4, the output signal at the output signal terminal OUTPUT is determined by the clock signal at the clock signal terminal CLK, which ensures normal output of the shift register unit.

Since the power supply signal VDD is at a high level for a long time, for example, in some application, the power supply signal VDD is at a high level for more than 2 seconds. It means that the transistor M9 and the transistor M10 are forwardly stressed for 2 seconds. This causes Vth of the transistor M9 and the transistor M10 to drift in a forward direction. By taking the transistor M9 and the transistor M10 as an example, when VDD is at a high level, the pull-down node PD is substantially at a high level during a period of time except for the time when the pull-up node PU is at a high level, and the transistor M9 and the transistor M10 are always be forwardly stressed during this period of time.

Figure 2B:
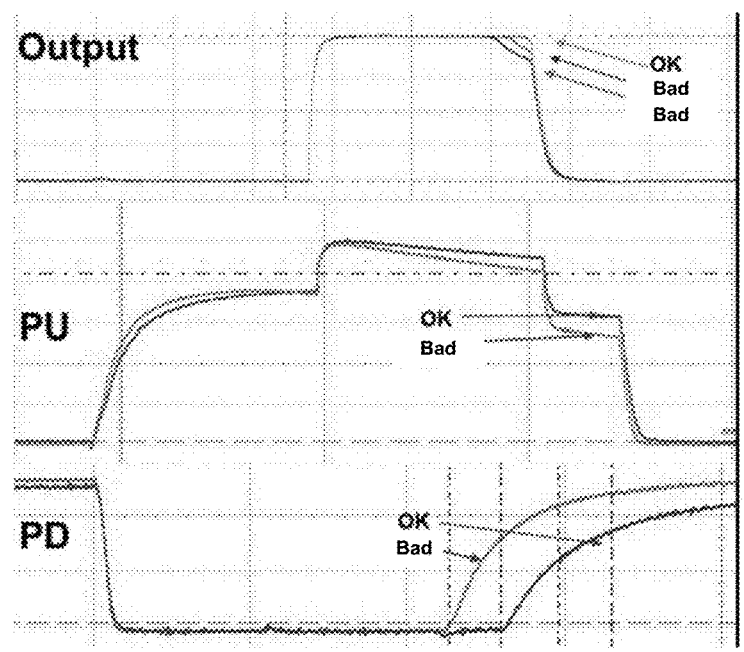
FIG. 2B specifically illustrates comparison of voltage waveforms of the shift register unit of FIG. 1.

The applicant has found that since the transistor M9 and the transistor M10 are forwardly stressed for a long time, a low temperature lighting abnormality and a high temperature lighting abnormality occur. On the one hand, in the period t2 in which the voltage at the pull-up node PU is raised up, INPUT is a high level signal, and the transistor M1 is turned on to charge the pull-up node PU to a high level. Since the pull-up node PU is charged to a high level, the transistor M7 and the transistor M8 are turned on, so that the pull-down node PD is discharged to the low level VSS, and thereby the transistor M9 which causes the pull-up node PU to be discharged is turned off. That is, it may be considered that the transistor M9 is a transistor which causes the pull-up node PU to be discharged under control of the pull-down node PD. On the other hand, it may be considered that the transistor M8 is a transistor which causes the pull-down node PD to be discharged under control of the pull-up node PU. In design, this is a competing relationship. For example, switching of these transistors may be controlled by designing sizes of the transistors. However, the applicant has found that in a low temperature case, since the transistors have low On-current Ion, the pull-up node PU is charged at a low speed, which results in a too long charging time. Especially for high-frequency products, the charging time is required to be short, which may result in that the pull-up node PU has not been fully charged when the next period t3 arrives, thereby causing decreased outputs at the pull-up node PU and the output signal terminal OUTPUT. This is illustrated in upper and middle portions of FIG. 2B. This situation may be referred to as "low temperature lighting abnormality".

Further, in the period t4, the potential at the pull-down node PD is raised up after the potential at the pull-up node PU falls. Theoretically, the potential at the pull-down node PD is raised up only after the potential at the pull-up node PU falls. However, due to high temperature and/or enhanced illumination, Off-current Ioff of the transistors increases, which causes attenuation of the potential at the pull-up node PU to be aggravated, and causes the potential at the pull-up node PU to fall excessively, thereby resulting in that the potential at the pull-down node PD is raised up in advance. This further causes the potential at the pull-up node PU to fall and causes an abnormality at OUTPUT. As may be seen from a lower portion of FIG. 2B, a waveform at the pull-down node PD in a bad area is significantly advanced with respect to a rising edge at the pull-down node PD in an OK area, and a waveform at the pull-up node PU in a bad area is seriously attenuated with respect to the potential at PU in an OK area. This causes the output waveform at OUTPUT to be chamfered with respect to a normal waveform. Similarly, this is due to the competing relationship between the transistor M9 and the transistor M8 during the rising and falling of the potentials at the pull-down node PD and the pull-up node PU. Although the switching of these transistors may be controlled by designing the sizes of the transistors, the Off-current Ioff of the transistors increases due to high temperature and/or enhanced illumination, which results in an abnormal waveform at OUTPUT. This situation may be referred to as "high temperature lighting abnormality".

Figure 2C:
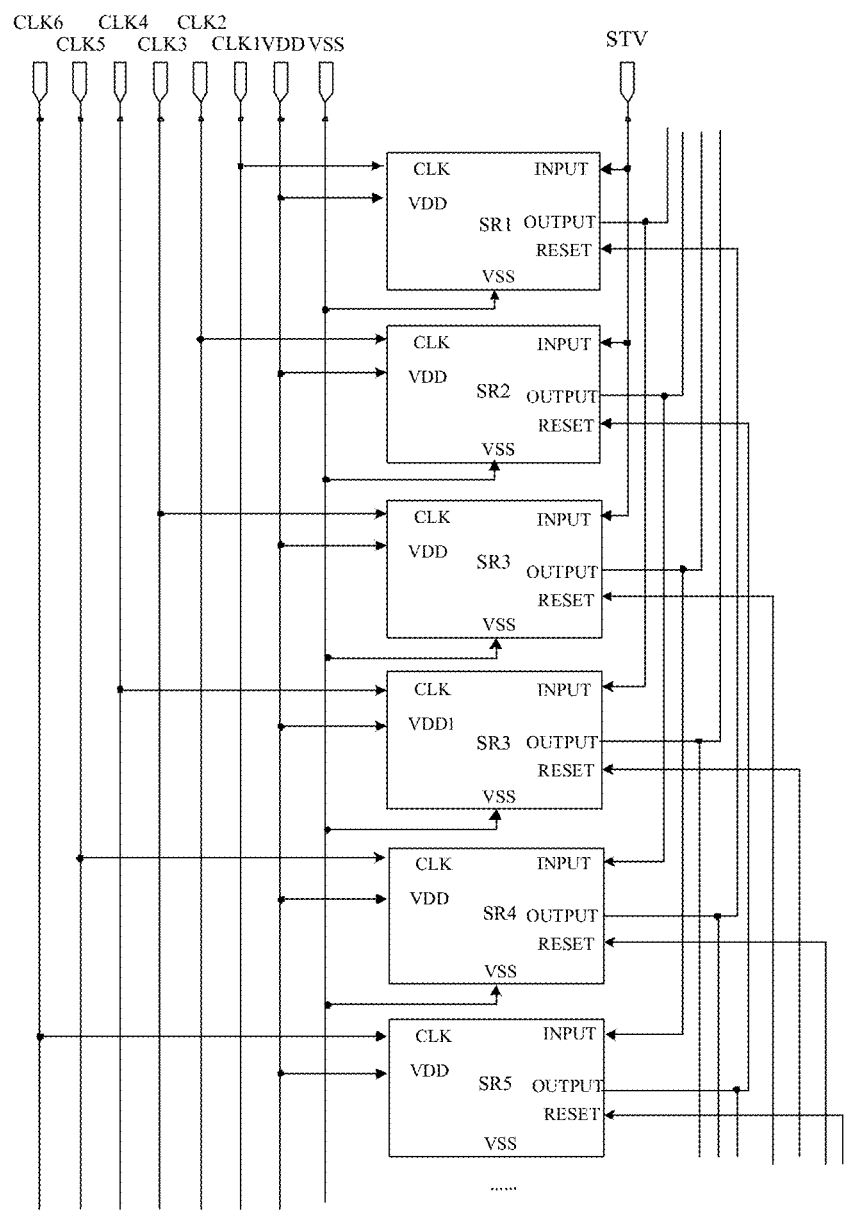
FIG. 2C illustrates an example in which shift register units of FIG. 1 are cascaded.

FIG. 2C illustrates an example in which shift register units of FIG. 1 are cascaded. As shown in FIG. 2C, due to the low temperature lighting abnormality and the high temperature lighting abnormality, a potential at a pull-up node PU and an output at OUTPUT of each stage of shift register unit among various stages of cascaded shift register units may gradually decrease stage by stage, which finally results in no output or multi-line output.

Figure 3A:
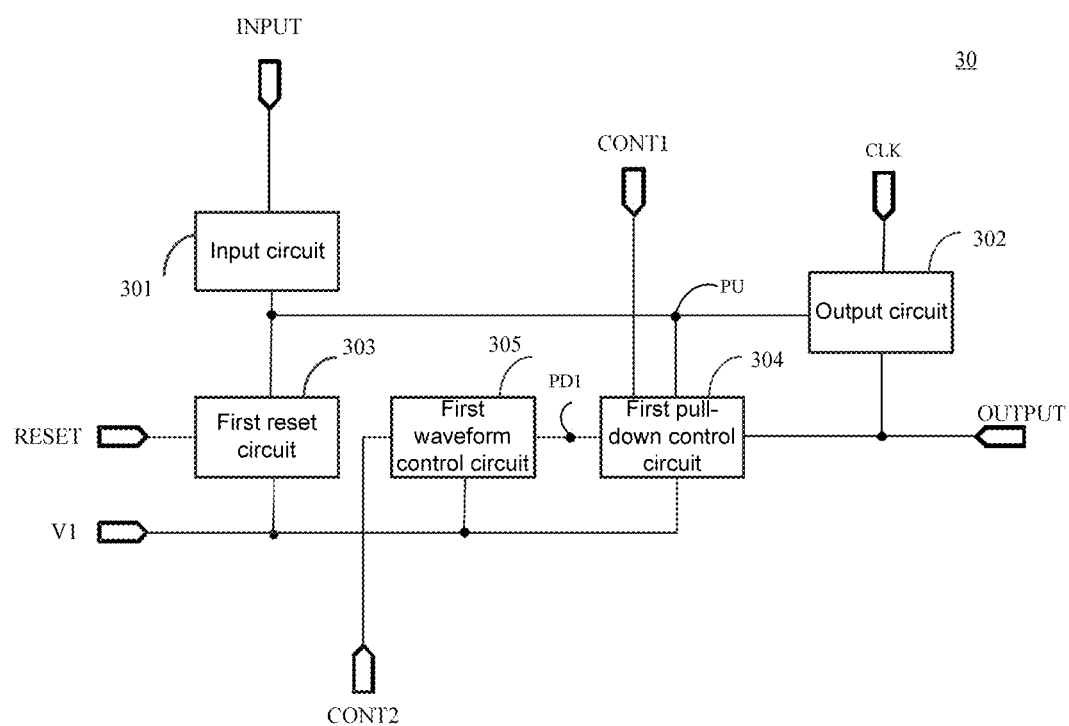
FIG. 3A illustrates a schematic block diagram of a shift register unit according to an embodiment of the present disclosure.

Therefore, the embodiments of the present disclosure provide a shift register unit. FIG. 3A illustrates a schematic block diagram of a shift register unit 30 according to an embodiment of the present disclosure. As shown in FIG. 3A, the shift register unit 30 according to the embodiment of the present disclosure may comprise an input circuit 301. The input circuit 301 is electrically connected to an input signal terminal INPUT and a pull-up node PU of the shift register unit 30. The input circuit 301 is configured to transmit an input signal Inputsg from the input signal terminal INPUT to the pull-up node PU.

The shift register unit 30 may further comprise an output circuit 302. The output circuit 302 is electrically connected to an output signal terminal OUTPUT, a clock signal terminal CLK, and the pull-up node PU. The output circuit 302 is configured to transmit a clock signal Clksg from the clock signal terminal CLK to the output signal terminal OUTPUT to be output as a gate driving signal under control of a voltage at the pull-up node PU.

The shift register unit 30 may further comprise a first reset circuit 303. The first reset circuit 303 is electrically connected to a first reset signal terminal RESET1, the pull-up node PU, and a first level terminal V1. The first reset circuit 303 is configured to reset the pull-up node PU to a first level at the first level terminal V1 under control of a first reset signal Resetsg1 from the first reset signal terminal RESET1.

The shift register unit 30 may further comprise a first pull-down control circuit 304. The first pull-down control circuit 304 is electrically connected to a first control signal terminal CONT1, the pull-up node PU, a first pull-down node PD1, the first level terminal V1, and the output signal terminal OUTPUT. The first pull-down control circuit 304 is configured to control levels at the pull-up node PU and the output signal terminal OUTPUT using the first level at the first level terminal V1 under control of a first control signal Contsg1 from the first control signal terminal CONT1.

The shift register unit 30 may further comprise a first voltage control circuit 305. The first voltage control circuit 305 is electrically connected to a second control signal terminal CONT2, the first pull-down node PD1, and the first level terminal V1. The first voltage control circuit 305 is configured to control a voltage signal waveform at the first pull-down node PD1 using the first level at the first level terminal V1 under control of a second control signal Contsg2 from the second control signal terminal CONT2.

Figure 3B:
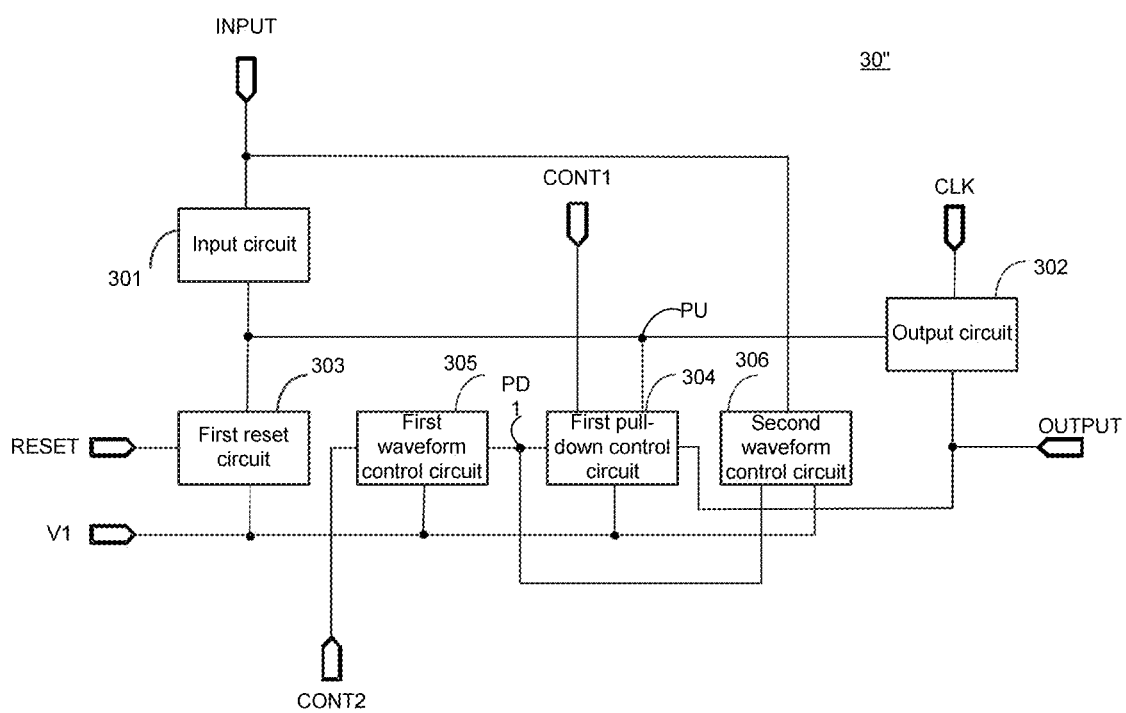
FIG. 3B illustrates another schematic block diagram of a shift register unit according to an embodiment of the present disclosure.

FIG. 3B illustrates another schematic block diagram of a shift register unit according to an embodiment of the present disclosure. As shown in FIG. 3B, the shift register unit 30' according to the embodiment of the present disclosure may further comprise a second voltage control circuit 306 as compared with the shift register unit 30 shown in FIG. 3A. The second voltage control circuit 306 may be electrically connected to the input signal terminal INPUT, the first pull-down node PD1, and the first level terminal V1. The second voltage control circuit 306 is configured to control the voltage signal waveform at the first pull-down node PD1 using the first level at the first level terminal V1 under control of the input signal Inputsg.

Figure 3C:
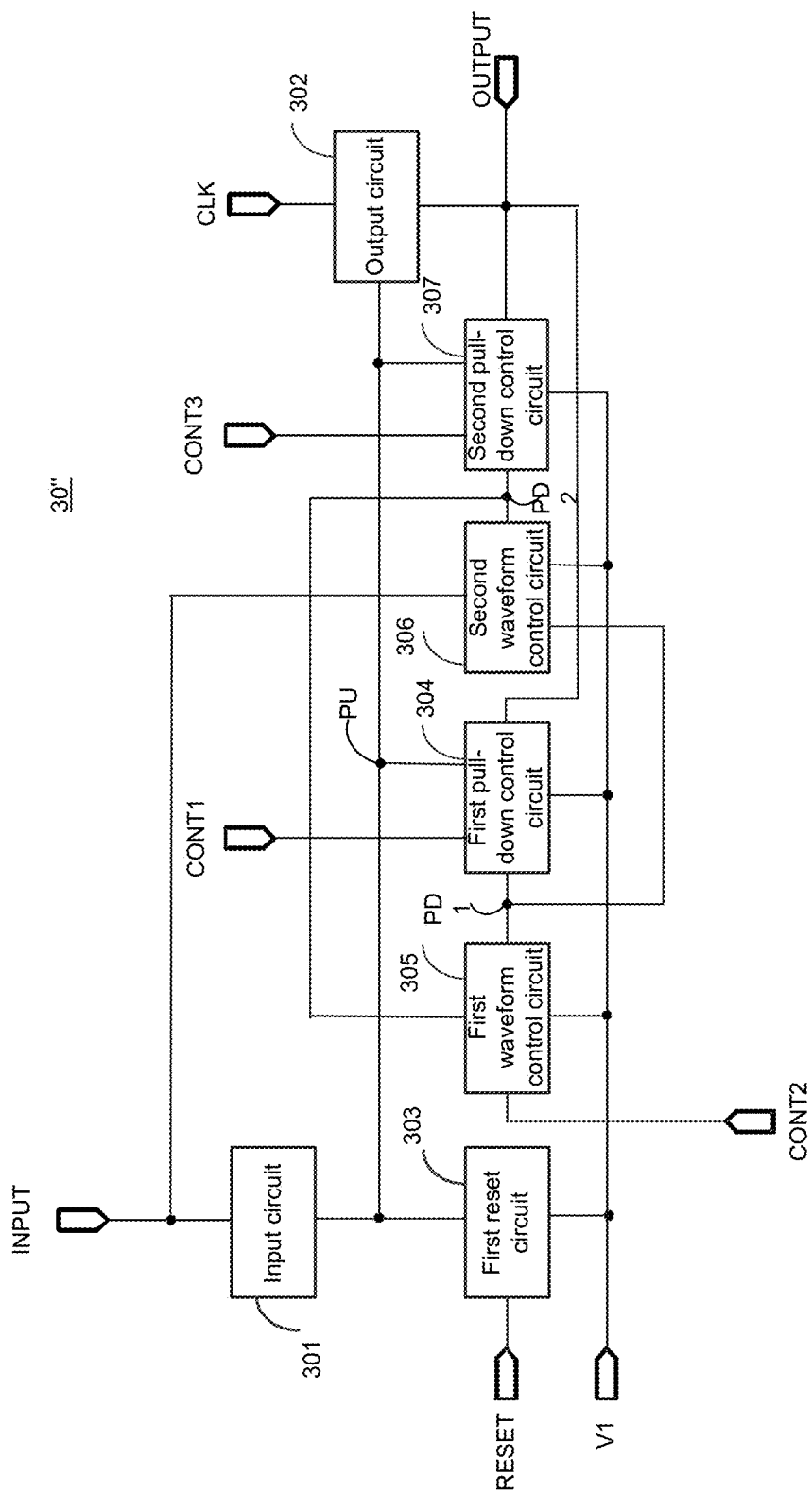
FIG. 3C illustrates yet another schematic block diagram of a shift register unit according to an embodiment of the present disclosure.

FIG. 3C illustrates yet another schematic block diagram of a shift register unit according to an embodiment of the present disclosure. As shown in FIG. 3C, the shift register unit 30" according to the embodiment of the present disclosure may further comprise a second pull-down control circuit 307 as compared with the shift register unit 30 shown in FIG. 3A. The second pull-down control circuit 307 is electrically connected to a third control signal terminal CONT3, the pull-up node PU, a second pull-down node PD2, the first level terminal V1, and the output signal terminal OUTPUT. The second pull-down control circuit 307 is configured to control the levels at the pull-up node PU and the output signal terminal OUTPUT using the first level at the first level terminal V1 under control of a third control signal Contsg3 from the third control signal terminal CONT3.

As shown in FIG. 3C, the first voltage control circuit 305 according to the embodiment of the present disclosure is further electrically connected to the second pull-down node PD2. The first voltage control circuit 305 is configured to control a voltage signal waveform at the second pull-down node PD2 using the first level at the first level terminal V1 under control of the second control signal Contsg2. The second voltage control circuit 306 according to the embodiment of the present disclosure is further electrically connected to the second pull-down node PD2. The second voltage control circuit 306 is configured to control the voltage signal waveform at the second pull-down node PD2 using the first level at the first level terminal V1 under control of the input signal Inputsg.

Figure 3D:
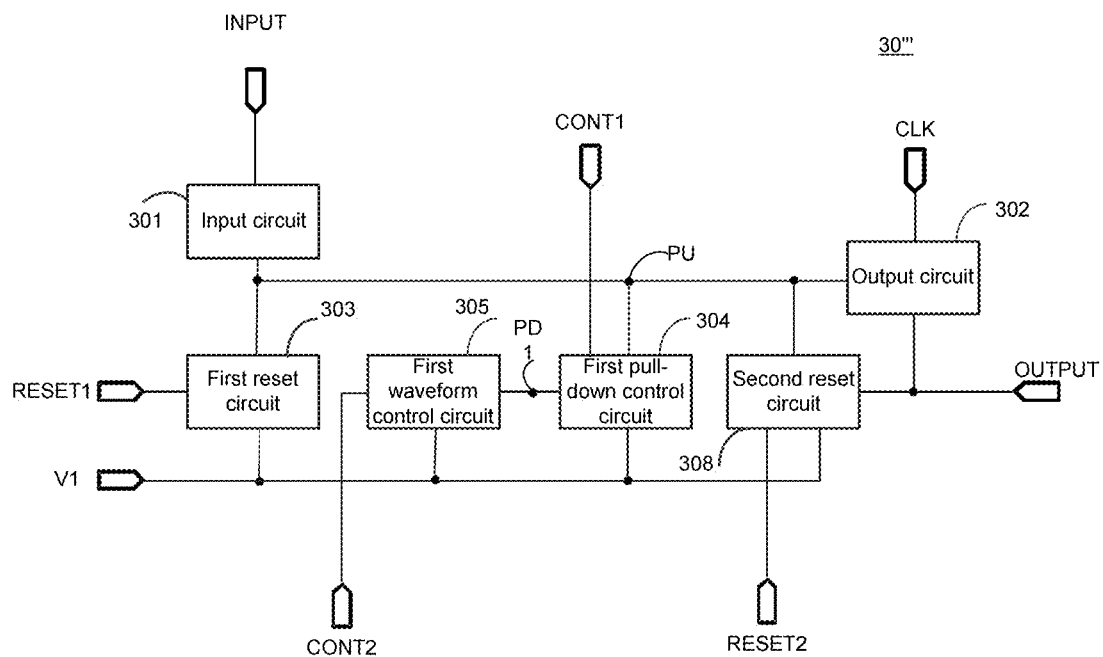
FIG. 3D illustrates a further schematic block diagram of a shift register unit according to an embodiment of the present disclosure.

FIG. 3D illustrates a further schematic block diagram of a shift register unit according to an embodiment of the present disclosure. As shown in FIG. 3D, the shift register unit 30''' according to the embodiment of the present disclosure may further comprise a second reset circuit 308 as compared with the shift register unit 30 shown in FIG. 3A. The second reset circuit 308 is electrically connected to a second reset signal terminal RESET2, the first level terminal V1, the pull-up node PU, and the output signal terminal OUTPUT, and is configured to reset the pull-up node PU and the output signal terminal to the first level under control of a second reset signal Resetsg2 from the second reset signal terminal RESET2.

It may be understood by those skilled in the art that embodiments of the present disclosure may further comprise various combinations of circuit structures in FIGS. 3A, 3B, 3C, and 3D, as long as the circuit functions according to embodiments of the present disclosure may be implemented. For example, the second reset circuit 308 may also be included in the circuit structure of FIG. 3D.

Figure 4A:
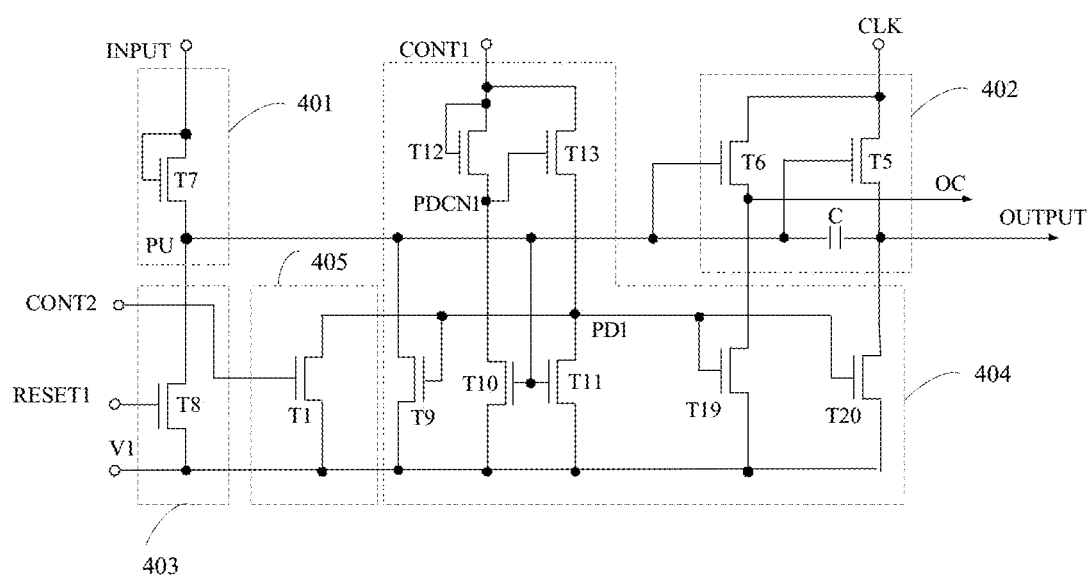
FIG. 4A illustrates an exemplary circuit diagram of a shift register unit according to an embodiment of the present disclosure.

FIG. 4A illustrates an exemplary circuit diagram of a shift register unit according to an embodiment of the present disclosure. As shown in FIG. 4A, in the shift register unit 40 according to the embodiment of the present disclosure, a first voltage control circuit 405 may comprise a first transistor T1. A control electrode of the first transistor T1 is electrically connected to a second control signal terminal CONT2, a first electrode of the first transistor T1 is electrically connected to a first level terminal V1, and a second electrode of the first transistor T1 is electrically connected to a first pull-down node PD1.

As shown in FIG. 4A, an input circuit 401 according to the embodiment of the present disclosure may comprise a seventh transistor T7. An output circuit 402 according to the embodiment of the present disclosure may comprise a fifth transistor T5, a sixth transistor T6, and a first capacitor C. A control electrode of the fifth transistor T5 is electrically connected to a pull-up node PU, a first electrode of the fifth transistor T5 is electrically connected to a clock signal terminal CLK, and a second electrode of the fifth transistor T5 is electrically connected to an output signal terminal OUTPUT. A control electrode of the sixth transistor T6 is electrically connected to the pull-up node PU, a first electrode of the sixth transistor T6 is electrically connected to the clock signal terminal CLK, and a second electrode of the sixth transistor T6 is electrically connected to a second output signal terminal OC. A first terminal of the first capacitor C is electrically connected to the control electrode of the fifth transistor T5, and a second terminal of the first capacitor C is electrically connected to the output signal terminal OUTPUT. Further, for example, a first reset circuit 403 according to the embodiment of the present disclosure may comprise an eighth transistor T8.

In addition, as shown in FIG. 4A, a first pull-down control circuit 404 according to the embodiment of the present disclosure may comprise a ninth transistor T9, a tenth transistor T10, an eleventh transistor T11, a twelfth transistor T12, and a thirteenth transistor T13. In addition, the first pull-down control circuit may further comprise a nineteenth transistor T19 and a twentieth transistor T20 configured to pull down potentials at the second output signal terminal OC and the output signal terminal OUTOUT under control of the first pull-down control signal PD1.

It should be understood that the circuit structure shown in FIG. 4A is merely an example, and in other embodiments of the present disclosure, the shift register unit may have other circuit structures. For example, in other embodiments, the second output signal terminal OC and the sixth transistor T6 may not be provided.

Figure 4B:
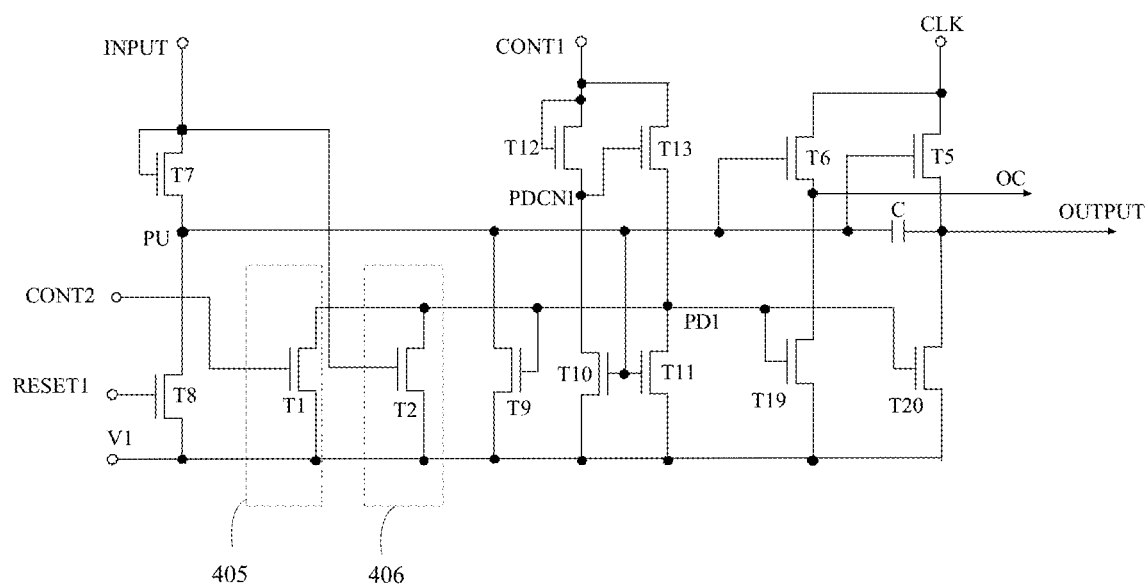
FIG. 4B illustrates another exemplary circuit diagram of a shift register unit according to an embodiment of the present disclosure.

FIG. 4B illustrates another exemplary circuit diagram of a shift register unit according to an embodiment of the present disclosure. As shown in FIG. 4B, unlike the example shown in FIG. 4A, the shift register unit 40' according to the embodiment of the present disclosure may further comprise a second voltage control circuit 406. The second voltage control circuit 406 may comprise a second transistor T2, wherein a control electrode of the second transistor T2 is electrically connected to an input signal terminal INPUT, a first electrode of the second transistor T2 is electrically connected to the first level terminal V1, and a second electrode of the second transistor T2 is electrically connected to the first pull-down node PD1.

Figure 4C:
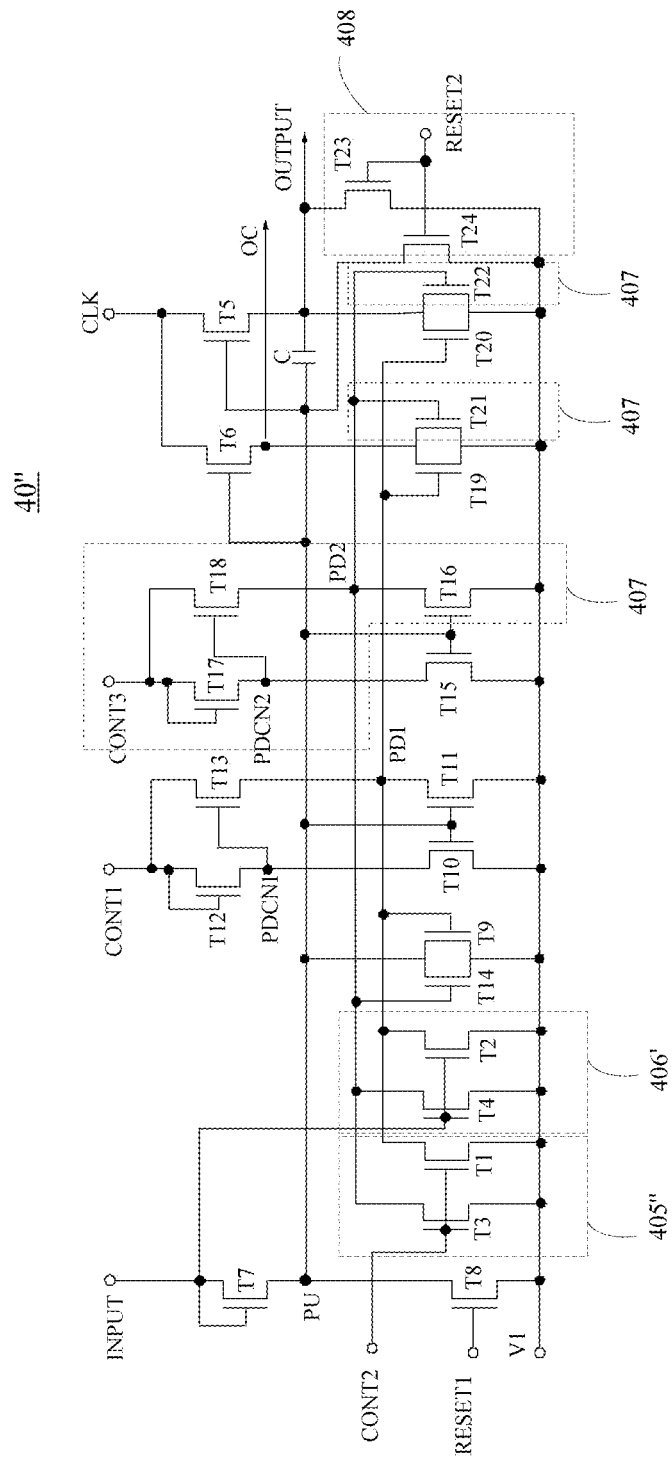
FIG. 4C illustrates yet another exemplary circuit diagram of a shift register unit according to an embodiment of the present disclosure.

FIG. 4C illustrates yet another exemplary circuit diagram of a shift register unit according to an embodiment of the present disclosure. As shown in FIG. 4C, unlike the example shown in FIG. 4A, the shift register unit 40" may further comprise a second pull-down control circuit 407. The second pull-down control circuit 407 has a third control signal terminal CONT3 configured to receive a third control signal Contsg3, and the second pull-down control circuit 407 is electrically connected to the pull-up node PU, a second pull-down node PD2, and the output signal terminal OUTPUT. A first voltage control circuit 405' may further comprise a third transistor T3. A control electrode of the third transistor T3 is electrically connected to the second control signal terminal CONT2, a first electrode of the third transistor T3 is electrically connected to the first level terminal V1, and a second electrode of the third transistor T3 is electrically connected to the second pull-down node PD2. The second voltage control circuit 406 further comprises a fourth transistor T4, wherein a control electrode of the fourth transistor T4 is electrically connected to the input signal terminal INPUT, a first electrode of the fourth transistor T4 is electrically connected to the first level terminal V1, and a second electrode of the fourth transistor T4 is electrically connected to the second pull-down node PD2.

In the circuit structure shown in FIG. 4C, the shift register unit comprises a first pull-down circuit 404 and a second pull-down circuit 407. The first pull-down node PD1 and the second pull-down node PD2 are alternately controlled to de-noise the pull-up node PU and the output signal terminal OUTPUT in the shift register unit in response to the first control signal Contsg1 and the third control signal Contsg3 in different frames alternately, thereby improving the signal tolerance of the shift register unit.

Further, the shift register unit 40″ may further comprise a second reset circuit 408. According to an embodiment of the present disclosure, the second reset circuit 408 may comprise a twenty-third transistor T23 and a twenty-fourth transistor T24 configured to further reset the potentials at the pull-up node PU and the output signal terminal OUTPUT under control of the second reset signal Resetsg2.

Further, for example, the second pull-down control circuit 407 according to the embodiment of the present disclosure may comprise a fourteenth transistor T14, a fifteenth transistor T15, a sixteenth transistor T16, a seventeenth transistor T17, and an eighteenth transistor T18. In addition, the second pull-down control circuit 407 may further comprise a twenty-first transistor T21 and a twenty-second transistor T22 configured to pull down the potentials at the second output signal terminal OC and the output signal terminal OUTOUT under control of the second pull-down control signal PD2.

Figure 5:
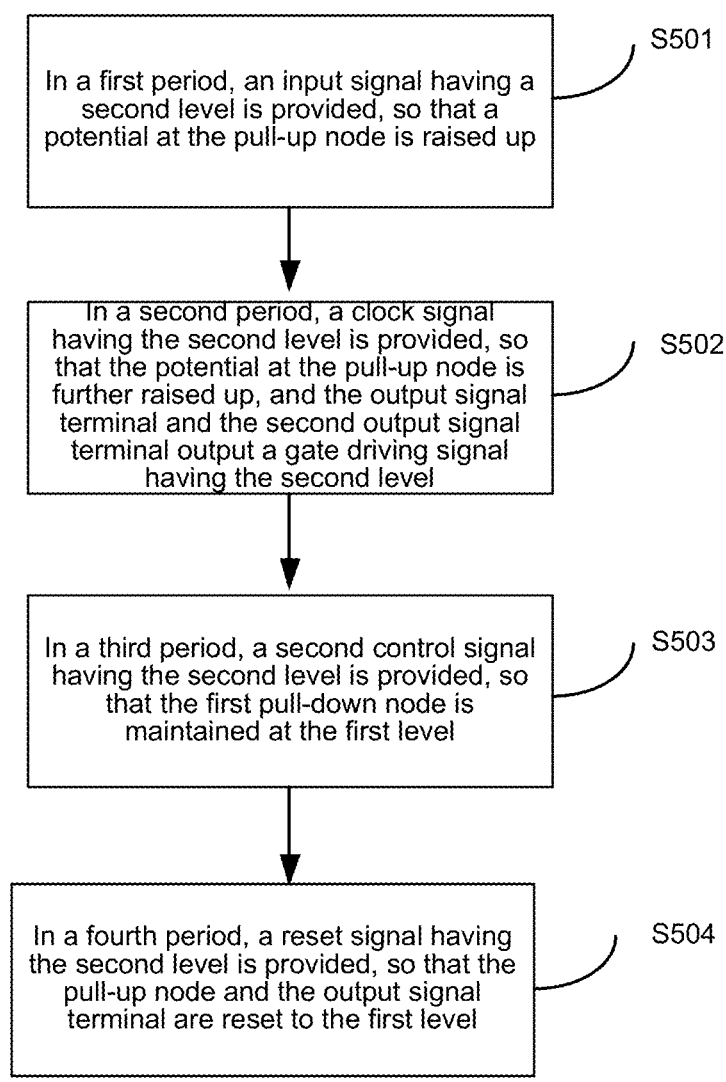
FIG. 5 illustrates a flowchart of a method for driving a shift register unit according to an embodiment of the present disclosure.

According to another aspect of the embodiments of the present disclosure, there is provided a method for driving a shift register unit, which may be applied to the shift register unit according to the embodiments of the present disclosure. It should be illustrated that serial numbers of the respective steps in the following method are only as a representation of the steps for convenience of description, and should not be regarded as indicating an execution order of the respective steps. This method does not need to be performed exactly in an order as shown, unless explicitly stated. FIG. 5 illustrates a flowchart of a method for driving a shift register unit according to an embodiment of the present disclosure. As shown in FIG. 5, the method 50 for driving a shift register unit according to the embodiment of the present disclosure may comprise the following steps.

In step S501, in a first period, an input signal having a second level is provided, so that a potential at the pull-up node is raised up.

In step S502, in a second period, a clock signal having the second level is provided, so that the potential at the pull-up node is further raised up, and the output signal terminal and the second output signal terminal output a gate driving signal having the second level.

In step S503, in a third period, a second control signal having the second level is provided, so that the first pull-down node is maintained at the first level.

In step S504, in a fourth period, a reset signal having the second level is provided, so that the pull-up node and the output signal terminal are reset to the first level.

According to an embodiment of the present disclosure, step S503 may further comprise: providing, in a first sub-period, a clock signal having the second level, so that the output signal terminal and the second output signal terminal continue to output the gate driving signal having the second level and the potential at the pull-up node is maintained at the level at the pull-up node in the second period; and providing, in a second sub-period, a clock signal having the first level, so that the output signal terminal and the second output signal terminal output the first level, and the potential at the pull-up node falls to the level at the pull-up node in the first period.

Figure 6A:
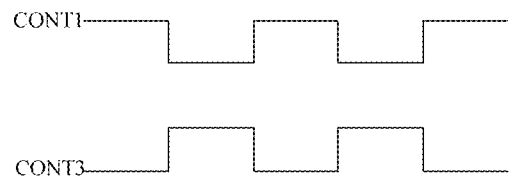
FIG. 6A illustrates a signal timing diagram of a first control signal and a third control signal according to an embodiment of the present disclosure.

According to an embodiment of the present disclosure, the first control signal Contsg1 and the third control signal Contsg3 have voltage signal waveforms as shown in FIG. 6A respectively. That is, the first control signal Contsg1 and the third control signal Contsg3 are co-frequency inverted signals, that is, there is always one of the first control signal Contsg1 and the third control signal Contsg3 which is at an active operating level. Therefore, the first pull-down control circuit and the second pull-down control circuit operate alternately. The first pull-down control circuit and the second pull-down control circuit have substantially the same circuit structure, and therefore, according to an embodiment of the present disclosure, an operation of the shift register unit when the first control signal Contsg1 is at an active operating level (for example, a high level) is the same as that when the second control signal Contsg3 is at an active operating level.

Figure 6B:
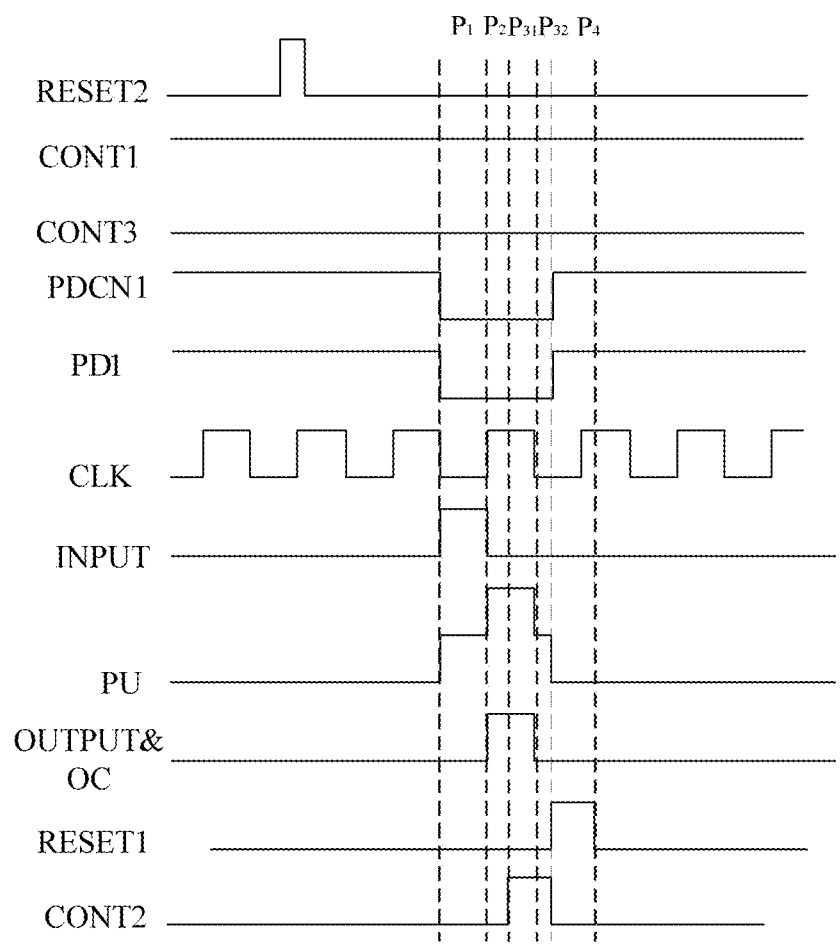
FIG. 6B illustrates an operational timing diagram of a shift register unit according to an embodiment of the present disclosure.

FIG. 6B illustrates an operational timing diagram of a shift register unit according to an embodiment of the present disclosure. An operation of the shift register unit according to the embodiment of the present disclosure will be described in detail below with reference to FIGS. 4, 5, 6A, and 6B. For convenience of description, the following examples are described by taking the first level being a low level and the second level being a high level as an example. Further, the following examples are described by taking the operation of the first pull-down control circuit as an example, that is, the first control signal Contsg1 is at a high level, and the third control signal Contsg3 is at a low level.

As shown in FIG. 6B, in a period $P_1$, the input signal Inputsg is at a high level, the seventh transistor T7 is turned on, and a voltage at the pull-up node PU starts to rise to charge the first capacitor C. Since the pull-up node PU is at a high level, the tenth transistor T10 and the eleventh transistor T11 are turned on, and a low level voltage signal V1 is transmitted to a node PDCN1 and the first pull-down node PD1 through the tenth transistor T10 and the eleventh transistor T11 respectively. At the same time, since the pull-up node PU is at a high level, the fifth transistor T5 and the sixth transistor T6 are turned on, and a clock signal at the clock signal terminal CLK is transmitted to the output signal terminal OUTPUT, and since the clock signal is at a low level at this time, output signals Output at the second output signal terminal OC and the output signal terminal are also at a low level. Further, since the input signal Inputsg is at a high level, the second transistor T2 and the fourth transistor T4 are turned on, which further ensures that the first pull-down node PD1 is at a low level.

In a period $P_2$, the clock signal at the clock signal terminal CLK is at a high level, the fifth transistor T5 and the sixth transistor T6 are continuously turned on under action of the pull-up node PU to transmit the clock signal to the output signal terminal OUTPUT and the second output signal terminal OC, and at this time, the output signals at the output signal terminal OUTPUT and the second output signal terminal OC are at a high level. A potential at the pull-up node PU is bootstrapped to a higher potential under the bootstrap action of the capacitor C.

In a period $P_3$, a second control signal Contsg2 is at a high level. The period $P_3$ may comprise a sub-period $P_{31}$ and a sub-period $P_{32}$. In the sub-period $P_{31}$, the clock signal is at a high level, the output signal terminal OUTPUT and the second output signal terminal OC continue to output a high level, and the potential at the pull-up node is further raised up. At this time, the second control signal Contsg2 becomes a high level, and the first transistor T1 is turned on to maintain the level at the first pull-down node PD1 at a low level.

In the sub-period $P_{32}$, the clock signal is at a low level, the potential at the pull-up node starts to fall, but the fifth transistor T5 and the sixth transistor T6 may still be turned on, and therefore the output signal terminal OUTPUT and the second output signal terminal OC output a low level. At this time, the second control signal Contsg2 is still at a high level, so that the first pull-down node PD1 is continuously maintained at a low level.

In a period $P_4$, the second control signal Contsg2 is at a low level, the first reset signal Resetsg1 is at a high level, and the eighth transistor T8 is turned on to reset the pull-up node PU to a low level.

After the period $P_4$, the first reset signal Resetsg1, the second reset signal Resetsg2, the input signal Inputsg, and the second control signal Contsg2 are all at a low level, and the first control signal Contsg1 is at a high level. At this time, since the twelfth transistor T12 is turned on and the thirteenth transistor T13 is turned on, the first pull-down node PD1 becomes a high level, so that the ninth transistor T9, the nineteenth transistor T19, and the twentieth transistor T20 are turned on. Thereby, the low level voltage signal V1 is transmitted to the pull-up node PU, the second output signal terminal OC, and the output signal terminal OUTPUT through the ninth transistor T9, the nineteenth transistor T19, and the twentieth transistor T20 respectively, to continuously de-noise the pull-up node PU, the second output signal terminal OC and the output signal terminal OUTPUT, that is, the signal at the pull-up node PU and the output signals at the second output signal terminal OC and the output signal terminal OUTPUT are all at a low level.

It should be illustrated that, for example, in the example in which the shift register shown in FIG. 4C comprises the second pull-down circuit 407, the operation principle of the shift register unit in the period in which the third control signal Contsg3 is at a high level is the same as that in the period in which the first control signal Contsg1 is at a high level, and will not be described in detail here for brevity. In addition, it may be understood by those skilled in the art that as shown in FIG. 6B, the output signal terminal OUTPUT and the second output signal terminal OC have the same voltage waveform.

Further, as shown in FIG. 6B, before the period $P_1$, the second reset signal Resetsg2 is at a high level, to further reset the levels at the pull-up node PU and the output signal terminal OUTPUT. For example, the second reset signal Resetsg2 may be set to a high level before display of each frame of image.

According to the technical solutions of the embodiments of the present disclosure, the first voltage control circuit is provided, so that in the period $P_3$, the first pull-down node PD1 (or the second pull-down node PD2) is maintained at a low level under control of the second control signal Contsg2. Thereby, the potential at the first pull-down node PD1 (or the second pull-down node PD2) is not raised up until the potential at the pull-up node PU falls. Further, the second voltage control circuit is provided, so that in the period $P_1$, the potential at the first pull-down node PD1 (or the second pull-down node PD2) rapidly falls when the potential at the pull-up node PU is raised up using the input signal Inputsg. As shown in FIG. 6B, a rising edge of a voltage waveform at the first pull-down node PD1 or the second pull-down node PD2 is after a falling edge of a voltage waveform at the pull-up node PU, which may avoid distortion of the signal waveform output by the shift register unit.

According to the embodiments of the present disclosure, there is further provided a gate driving circuit comprising N stages of cascaded shift register units according to the embodiments of the present disclosure. According to the embodiments of the present disclosure, a clock signal terminal of an $n^{th}$ stage of shift register unit is electrically connected to one of a first clock signal to an $I^{th}$ first clock signal of I clock signals, an output signal terminal or a second output signal terminal of the $n^{th}$ stage of shift register unit is electrically connected to an input signal terminal of an $(n+I/2)^{th}$ stage of shift register unit, a first reset signal terminal of the $n^{th}$ stage of shift register unit is electrically connected to an output signal terminal or a second output signal terminal of an $(n+1+I/2)^{th}$ stage of shift register unit, wherein N is an integer greater than or equal to 4, n is an integer greater than or equal to 1 and less than (N−I/2), and I is an even number.

Here, a second control signal terminal of the $n^{th}$ stage of shift register unit is electrically connected to an output signal terminal or a second output signal terminal of an $(n+K)^{th}$ stage of shift register unit, wherein K is an integer greater than or equal to 1 and less than or equal to I/2. In some embodiments, K=1, so that a falling edge of the second control signal is just slightly ahead of or is substantially synchronous with a rising edge of the reset signal.

Figure 7A:
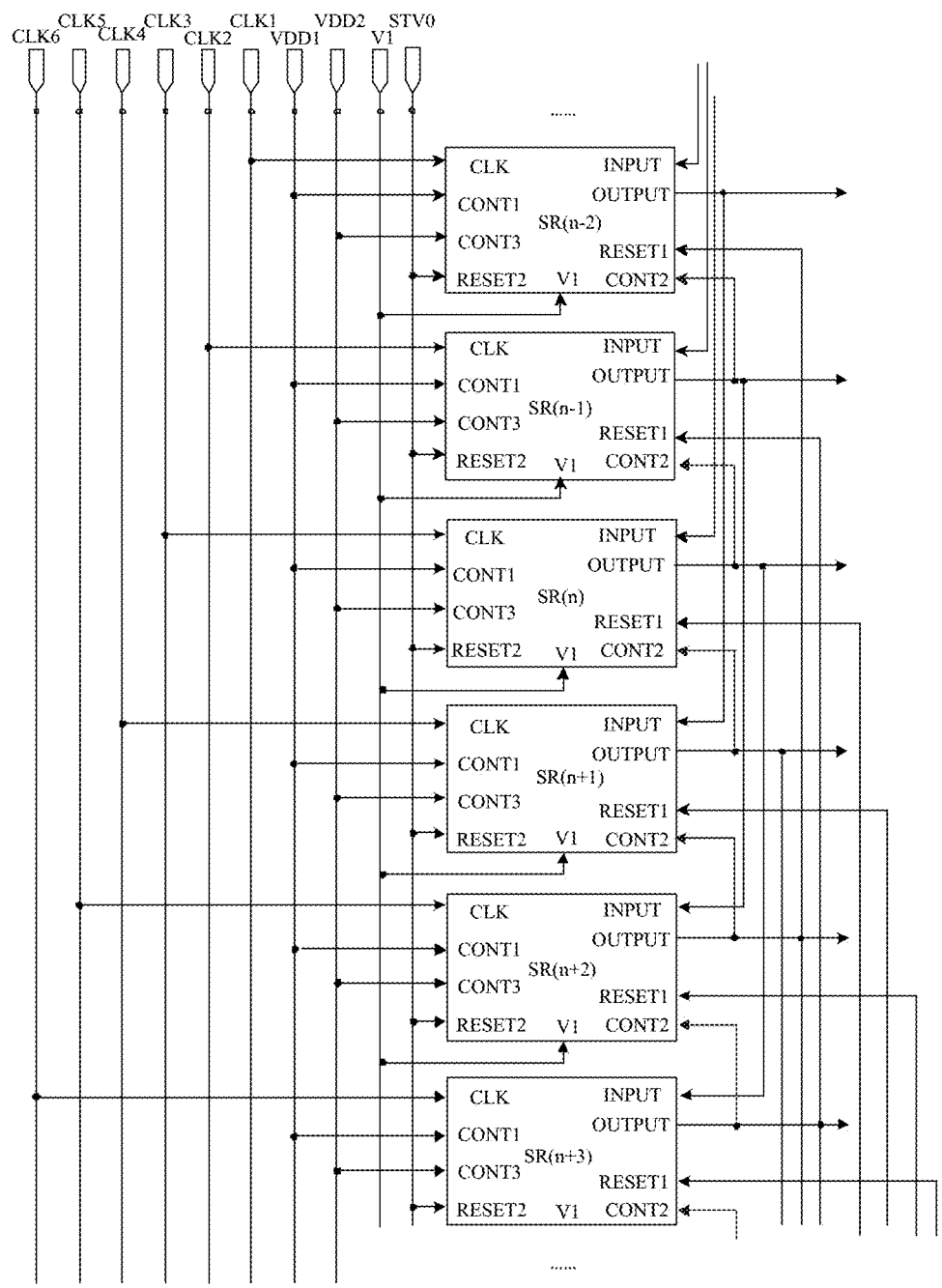
FIG. 7A illustrates an exemplary manner in which shift register units in a gate driving circuit are cascaded according to an embodiment of the present disclosure.

FIG. 7A illustrates an exemplary gate driving circuit according to an embodiment of the present disclosure. Six clock signals CLK1 to CLK6 are used in the example of FIG. 7A. That is, in the present example, a number I of clock signal lines is equal to 6. In the example of FIG. 7A, the shift register unit according to the embodiment of the present disclosure does not have the second output signal terminal OC. Clock signal terminals CLK of an $(n−2)^{th}$ stage of shift register unit SR(n−2) to an $(n+3)^{th}$ stage of shift register unit SR(n+3) are sequentially electrically connected to the clock signals CLK1 to CLK6. By taking an $n^{th}$ stage of shift register unit SR(n) as an example, an output signal terminal OUTPUT of the $n^{th}$ stage of shift register unit SR(n) is electrically connected to an input signal terminal INPUT of the $(n+3)^{th}$ stage of shift register unit SR(n+3), and a first reset signal terminal RESET1 of the $n^{th}$ stage of shift register unit SR(n) is electrically connected to an output signal terminal OUTPUT of an $(n+4)^{th}$ stage of shift register unit SR(n+4).

In the example of FIG. 7A, description is made by taking K=1 as an example, that is, a second control signal terminal CONT2 of the $n^{th}$ stage of shift register unit SR(n) is electrically connected to an output signal terminal OUTPUT of an $(n+1)^{th}$ stage of shift register unit.

Figure 7B:
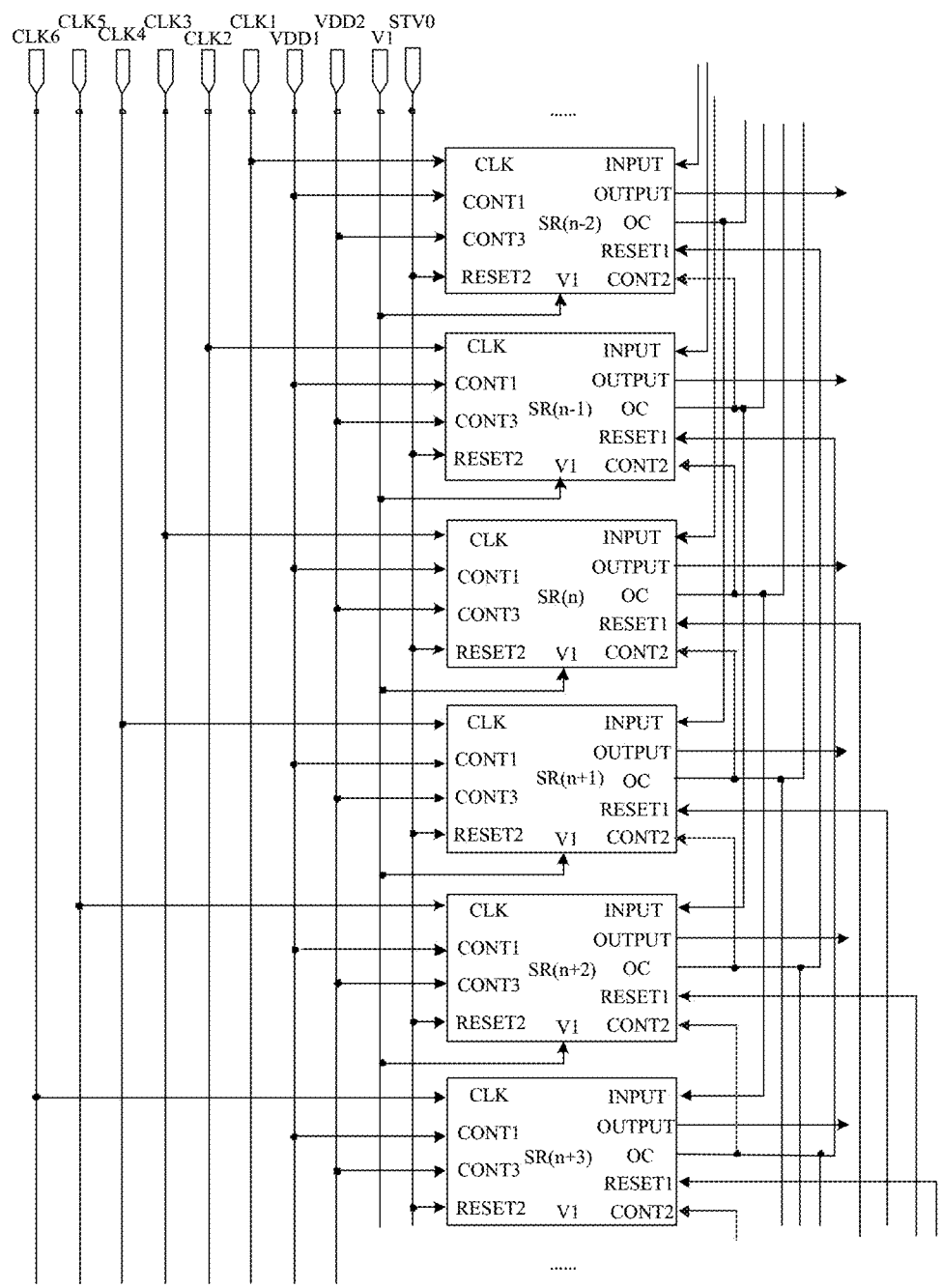
FIG. 7B illustrates another exemplary manner in which shift register units in a gate driving circuit are cascaded according to an embodiment of the present disclosure.

FIG. 7B illustrates another exemplary gate driving circuit according to an embodiment of the present disclosure. Again, six clock signals CLK1 to CLK6 are used in the example of FIG. 7B. In the example of FIG. 7B, the shift register unit according to the embodiment of the present disclosure has the second output signal terminal OC. By taking the $n^{th}$ stage of shift register unit SR(n) as an example, a second output signal terminal OC of the $n^{th}$ stage of shift register unit SR(n) is electrically connected to an input signal terminal INPUT of an $(n+3)^{th}$ stage of shift register unit SR(n+3), and a first reset signal terminal RESET1 of the $n^{th}$ stage of shift register unit SR(n) is electrically connected to a second output signal terminal OC of an $(n+4)^{th}$ stage of shift register unit SR(n+4).

In the example of FIG. 7B, description is also made by taking K=1 as an example, that is, a second control signal terminal CONT2 of the $n^{th}$ stage of shift register unit SR(n) is electrically connected to a second output signal terminal OC of an $(n+1)^{th}$ stage of shift register unit.

It may be understood by those skilled in the art that although an output signal Outputsg of each stage of shift register unit SR(n) in the example of FIG. 7B serves only as a gate driving signal, since the output signal Outputsg and the second output signal OC have the same signal waveform, in the example of FIG. 7B, an output signal terminal OUTPUT of the $n^{th}$ stage of shift register unit SR(n) may further be electrically connected to the input signal terminal INPUT of the $(n+3)^{th}$ stage of shift register unit SR(n+3), the first reset signal terminal RESET1 of the $n^{th}$ stage of shift register unit SR(n) may further be electrically connected to an output signal terminal OUTPUT of the $(n+4)^{th}$ stage of shift register unit SR(n+4), and the second control signal terminal CONT2 of the $n^{th}$ stage of shift register unit SR(n) may further be electrically connected to an output signal terminal OUTPUT of the $(n+1)^{th}$ stage of shift register unit, which is not limited in the embodiments of the present disclosure.

Further, it may be understood by those skilled in the art that although the above embodiments are described by taking six clock signals as an example, the embodiments of the present disclosure may be applied to a case where four clocks or eight clocks are used.

Further, second reset signal terminals RESET2 of the N stages of cascaded shift register units may be electrically connected to a signal STV0. Before the start of display of each frame, STV0 may be set to an active level, for example, a high level, for a period of time, and the twenty-third transistor T23 and the twenty-fourth transistor T24 are turned on, so that the pull-up node PU, the second output signal terminal OC and the output signal terminal OUTPUT of the shift register unit are discharged.

It may be understood by those skilled in the art that the second output signal terminal of the $n^{th}$ stage of shift register unit is electrically connected to the input signal terminal of the $(n+I/2)^{th}$ stage of shift register unit, that is, a second output signal terminal of the $(n-1-I/2)^{th}$ stage of shift register unit is electrically connected to the input signal terminal of the $n^{th}$ stage of shift register unit. When the $(n-1-I/2)^{th}$ stage of shift register unit is not present, the input signal terminal of the $n^{th}$ stage of shift register unit may be electrically connected to, for example, a frame Start Vertical (STV) signal.

Figure 8:
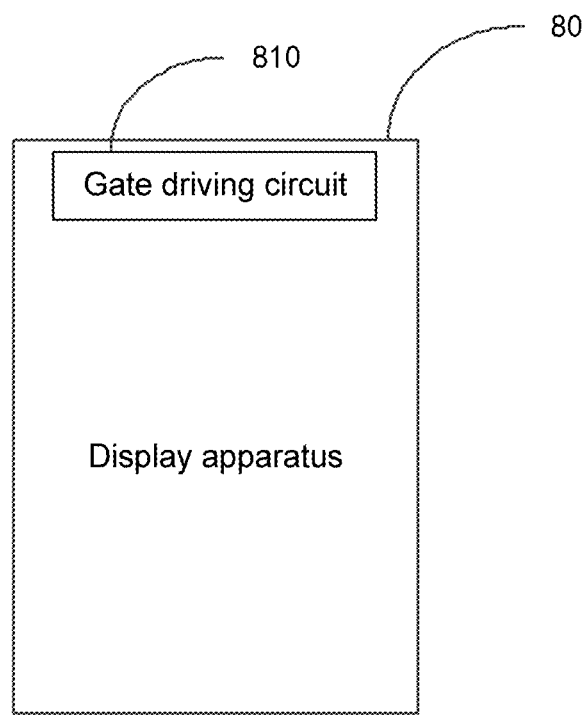
FIG. 8 illustrates a schematic block diagram of a display apparatus according to an embodiment of the present disclosure.

FIG. 8 illustrates a schematic block diagram of a display apparatus according to an embodiment of the present disclosure. As shown in FIG. 8, the display apparatus 80 may comprise a gate driving circuit 810 according to an embodiment of the present disclosure. The display apparatus 80 according to the embodiment of the present disclosure may be any product or component having a display function, such as an electronic paper, a mobile phone, a tablet computer, a television, a display, a notebook computer, a digital photo frame, a navigator, etc.

The embodiments of the present disclosure provide a shift register unit and a method for driving the same, a gate driving circuit, and a display apparatus comprising the gate driving circuit. According to the embodiments of the present disclosure, the discharging of the pull-down node in the shift register unit is controlled by improving the circuit structure of the shift register unit, so that the waveform of the output gate driving signal may be adjusted. For example, the pull-down node is maintained at a low level using the second control signal, to ensure that the potential at the pull-down node is not raised up until the potential at the pull-up node falls, thus avoiding excessive attenuation of the potential at the pull-up node and thereby preventing the output gate driving signal from being chamfered. Further, according to the embodiments of the present disclosure, it is further ensured using the input signal that the pull-down node is at a low level when the potential at the pull-up node starts to be pulled up, so as to avoid excessive attenuation of the potential at the pull-up node. Further, according to the embodiments of the present disclosure, there is further provided a manner in which the shift registers are cascaded. An operational timing of the shift register unit according to the embodiment of the present disclosure may be realized by using a second output signal or a gate driving signal of a next stage of shift register unit as a second control signal of a previous stage of shift register unit.

The specific embodiments described above further illustrate the purposes, technical solutions and beneficial effects of the embodiments of the present disclosure. It is to be understood that the foregoing description is merely specific embodiments of the present disclosure, and is not intended to limit the present disclosure. Any modifications, equivalent substitutions, improvements etc. made within the spirit and principle of the present disclosure shall be included within the protection scope of the present disclosure.

We claim:

1. A gate driving circuit, comprising N stages of cascaded shift register units, wherein:

a clock signal terminal of an $n^{th}$ stage of shift register unit receives one of a first clock signal to an $I^{th}$ clock signal, an output signal terminal or a second output signal terminal of the $n^{th}$ stage of shift register unit is electrically connected to an input signal terminal of an $(n+I/2)^{th}$ stage of shift register unit, and a first reset signal terminal of the $n^{th}$ stage of shift register unit is electrically connected to an output signal terminal or a second output signal terminal of an $(n+1+I/2)^{th}$ stage of shift register unit, wherein N is an integer greater than or equal to 4, n is an integer greater than or equal to 1 and less than (N−I/2), and I is an even number;

wherein each of the shift register units comprises:

an input circuit electrically connected to an input signal terminal and a pull-up node of the shift register unit, and configured to transmit an input signal from the input signal terminal to the pull-up node;

an output circuit electrically connected to an output signal terminal, a clock signal terminal and the pull-up node, and configured to transmit a clock signal from the clock signal terminal to the output signal terminal under control of a voltage at the pull-up node;

a first reset circuit electrically connected to a first reset signal terminal, the pull-up node and a first level terminal, and configured to reset the pull-up node to a first level at the first level terminal under control of a first reset signal from the first reset signal terminal;

a first pull-down control circuit electrically connected to a first control signal terminal, the pull-up node, a first pull-down node of the shift register unit, the first level terminal, and the output signal terminal, and configured to control levels at the pull-up node and the output signal terminal using the first level at the first level terminal under control of a first control signal from the first control signal terminal; and a first voltage control circuit electrically connected to a second control signal terminal, the first pull-down node and the first level terminal, and configured to control a voltage signal waveform at the first pull-down node using the first level at the first level terminal under control of a second control signal from the second control signal terminal.

2. The gate driving circuit according to claim 1, wherein a second control signal terminal of the $n^{th}$ stage of shift register unit is electrically connected to an output signal terminal or a second output signal terminal of an $(n+K)^{th}$ stage of shift register unit, wherein K is an integer greater than or equal to 1 and less than or equal to I/2.

3. The gate driving circuit according to claim 1, wherein the shift register unit further comprises:
a second voltage control circuit electrically connected to the input signal terminal, the first pull-down node, and the first level terminal, and configured to control the voltage signal waveform at the first pull-down node using the first level at the first level terminal under control of the input signal.

4. The gate driving circuit according to claim 1, wherein the first voltage control circuit comprises a first transistor, and wherein:
a control electrode of the first transistor is electrically connected to the second control signal terminal, a first electrode of the first transistor is electrically connected to the first level terminal, and a second electrode of the first transistor is electrically connected to the first pull-down node.

5. The gate driving circuit according to claim 3, wherein the second voltage control circuit comprises a second transistor, and wherein:
a control electrode of the second transistor is electrically connected to the input signal terminal, a first electrode of the second transistor is electrically connected to the first level terminal, and a second electrode of the second transistor is electrically connected to the first pull-down node.

6. The gate driving circuit according to claim 5, further comprising:
a second pull-down control circuit electrically connected to a third control signal terminal, the pull-up node, a second pull-down node of the shift register unit, the first level terminal and the output signal terminal, and configured to control the levels at the pull-up node and the output signal terminal using the first level at the first level terminal under control of a third control signal from the third control signal terminal.

7. The gate driving circuit according to claim 6, wherein the first voltage control circuit is further electrically connected to the second pull-down node, and is further configured to control a voltage signal waveform at the second pull-down node using the first level at the first level terminal under control of the second control signal.

8. The gate driving circuit according to claim 7, wherein the first voltage control circuit further comprises a third transistor, and wherein:
a control electrode of the third transistor is electrically connected to the second control signal terminal, a first electrode of the third transistor is electrically connected to the first level terminal, and a second electrode of the third transistor is electrically connected to the second pull-down node.

9. The gate driving circuit according to claim 5, further comprising:
a second pull-down control circuit electrically connected to a third control signal terminal, the pull-up node, a second pull-down node of the shift register unit, the first level terminal and the output signal terminal, and configured to control the levels at the pull-up node and the output signal terminal using the first level at the first level terminal under control of a third control signal from the third control signal terminal.

10. The gate driving circuit according to claim 9, wherein the second voltage control circuit is further electrically connected to the second pull-down node, and is further configured to control a voltage signal waveform at the second pull-down node using the first level at the first level terminal under control of the input signal.

11. The gate driving circuit according to claim 10, wherein the second voltage control circuit further comprises a fourth transistor, and wherein:
a control electrode of the fourth transistor is electrically connected to the input signal terminal, a first electrode of the fourth transistor is electrically connected to the first level terminal, and a second electrode of the fourth transistor is electrically connected to the second pull-down node.

12. The gate driving circuit according to claim 5, wherein the output circuit comprises a fifth transistor and a first capacitor, and wherein:
a control electrode of the fifth transistor is electrically connected to the pull-up node, a first electrode of the fifth transistor is electrically connected to the clock signal terminal, and a second electrode of the fifth transistor is electrically connected to the output signal terminal; and
a first terminal of the first capacitor is electrically connected to the control electrode of the fifth transistor, and a second terminal of the first capacitor is electrically connected to the output signal terminal.

13. The gate driving circuit according to claim 12, wherein the output circuit further comprises a sixth transistor, and wherein:
a control electrode of the sixth transistor is electrically connected to the pull-up node, a first electrode of the sixth transistor is electrically connected to the clock signal terminal, and a second electrode of the sixth transistor is electrically connected to the second output signal terminal.

14. The gate driving circuit according to claim 1, wherein the shift register unit further comprises:
a second reset circuit electrically connected to a second reset signal terminal, the first level terminal, the pull-up node and the output signal terminal, and configured to reset the pull-up node and the output signal terminal to the first level at the first level terminal under control of a second reset signal from the second reset signal terminal.

15. A display apparatus, comprising a gate driving circuit, the gate driving circuit comprising N stages of cascaded shift register units, wherein:
a clock signal terminal of an $n^{th}$ stage of shift register unit receives one of a first clock signal to an $I^{th}$ clock signal, an output signal terminal or a second output signal terminal of the $n^{th}$ stage of shift register unit is electrically connected to an input signal terminal of an $(n+I/2)^{th}$ stage of shift register unit, and a first reset signal terminal of the $n^{th}$ stage of shift register unit is electrically connected to an output signal terminal or a second output signal terminal of an $(n+1+I/2)^{th}$ stage of shift register unit, wherein N is an integer greater than or equal to 4, n is an integer greater than or equal to 1 and less than (N−I/2), and I is an even number;
wherein each of the shift register units comprises:
an input circuit electrically connected to an input signal terminal and a pull-up node of the shift register unit, and configured to transmit an input signal from the input signal terminal to the pull-up node;
an output circuit electrically connected to an output signal terminal, a clock signal terminal and the pull-up node, and configured to transmit a clock signal from the clock signal terminal to the output signal terminal under control of a voltage at the pull-up node;

a first reset circuit electrically connected to a first reset signal terminal, the pull-up node and a first level terminal, and configured to reset the pull-up node to a first level at the first level terminal under control of a first reset signal from the first reset signal terminal;

a first pull-down control circuit electrically connected to a first control signal terminal, the pull-up node, a first pull-down node of the shift register unit, the first level terminal, and the output signal terminal, and configured to control levels at the pull-up node and the output signal terminal using the first level at the first level terminal under control of a first control signal from the first control signal terminal; and a first voltage control circuit electrically connected to a second control signal terminal, the first pull-down node and the first level terminal, and configured to control a voltage signal waveform at the first pull-down node using the first level at the first level terminal under control of a second control signal from the second control signal terminal.

16. The display apparatus according to claim 15, wherein a second control signal terminal of the $n^{th}$ stage of shift register unit is electrically connected to an output signal terminal or a second output signal terminal of an $(n+K)^{th}$ stage of shift register unit, wherein K is an integer greater than or equal to 1 and less than or equal to I/2.

* * * * *